United States Patent

Miyamoto et al.

[11] Patent Number: 5,820,680
[45] Date of Patent: Oct. 13, 1998

[54] VACUUM EVAPORATOR

[75] Inventors: Kazuo Miyamoto, Saitama; Humio Watanabe, Ibaragi, both of Japan

[73] Assignees: Musashino Engineering Co., Ltd., Saitama; Sukegawa Electric Co., Ltd., Ibaragi, both of Japan

[21] Appl. No.: 839,322

[22] Filed: Apr. 17, 1997

[51] Int. Cl.$^6$ .................................................. C23C 16/00
[52] U.S. Cl. ..................... 118/723 EB; 118/726
[58] Field of Search .............................. 118/723 EB, 726

[56] References Cited

U.S. PATENT DOCUMENTS 2,960,457 11/1960 Kuhlman ........................ 118/723 EB Primary Examiner—Richard Bueker
Attorney, Agent, or Firm—Kanesaka & Takeuchi

[57] ABSTRACT

A vacuum evaporator is characterized in that hot-cathode filaments (7) are provided as the electron source around a tip of a rod evaporation material (4); the peripheries of the rod evaporation material (4) and the hot-cathode filaments (7) are disposed in parallel to a conductive cooling member (1) of a good heat conductive metal which is partly contacted with the atmosphere to decrease the dissipation of radiation heat produced from the hot-cathode filaments (7) and a tip (41) of the rod evaporation material (4) into a vacuum vessel a; heat absorbed by the conductive cooling member (1) is quickly conducted through the conductive cooling member and discharged to the atmosphere to prevent the temperature of the electron impact heating part from increasing and to prevent the increase of the gas discharge due to the heat dissipation from the electron impact heating part.

5 Claims, 7 Drawing Sheets

VACUUM EVAPORATOR

BACKGROUND OF THE INVENTION

1. Field of the Invention

The present invention relates to an evaporation source (Knudsen cell or e-gun) of a vacuum evaporator for so-called dry plating by which a solid material is melted or sublimated in a vacuum device by electron impact heating so as to be evaporated as atomic or molecular beams and adhered onto a solid deposition substrate, or to a molecular beam source of a molecular beam crystal growth device (MBE) by which evaporated molecular beams are gradually deposited on a crystal substrate to form a crystalline film.

2. Description of the Related Art

Vacuum deposition of a solid material is a very significant technology from an industrial point of view and inevitable to form a film. Known evaporation methods include a resistance heating method and an electron impact heating method. The resistance heating method is a type which directly contacts an evaporation source material with an evaporation material (film material), and the evaporation source material has a temperature higher than the thin film material, so that there are disadvantages such as mixing of impurities into the film material, a reaction with the evaporation source material and a limitation owing to a melting point of the evaporation source material. The electron impact heating method was developed to avoid such disadvantages and directly hits the electrons against a portion of the evaporation material for heating.

Such highly purified film forming technologies are increasing in importance as the electronics-related technologies undergo further development, and an electron beam heating method which does need to take an evaporation source container material into account stands without a rival at forming a film by depositing a high-melting point material. Its most prominent advantage is that since the solid evaporation material can be partly heated to be melted and evaporated by squeezing the electron beam into a thin line, a crucible for the melted material is not needed, and a material for the crucible does not melt into a melted evaporation liquid. As the electron source in this case, known methods include one which uses an electron gun A, namely an electron gun (e-gun) which accelerates electron beams of 10 to 110 mA taken out of a hot-cathode filament with a high-voltage electric source of 10 to 10 KV to linearly hit a sample C from a distance as shown in FIG. 7, and one which deflects electron beams (electron beams E) by a magnetic field as shown in FIG. 8. In FIG. 7 and FIG. 8, B denotes an accelerating electrode, D a cooling water, and d a substrate. And, the latter method is mainly used today.

But, the electron beam heating method using the electron gun has disadvantages as given below.

(1) It is necessary to precisely control the electron beams, the electrode has a complex structure and a large size, and the device is expensive.

(2) A melted material holding member on the side where the electron beams do not reach is required to be kept water-cooled, requiring a water-cooling line. And, this structure may often become the cause of a trouble.

As an electron beam heating method which does not have the above-described disadvantages (1) and (2), there is a known method by that a rod evaporation material 4 has its leading end directly exposed to electrons coming out of a hot-cathode filament 7 which is provided in the neighborhood of the material to melt and evaporate the leading end only as shown in FIG. 9. This method does not need a crucible either, and a high-melting point material can be subjected to high purity deposition. And, the device is very simple and inexpensive. In the drawing, M denotes molecular beams, f a high-voltage power source, and h a filament heating power source.

But, this method also has disadvantages as follows.

(3) The evaporation substance scatters into the whole space to contaminate a vacuum vessel.

(4) The temperature of the vacuum vessel is raised by radiation heat which is generated from the hot-cathode filament and the melted part, and its vacuum is degraded.

(5) As means for remedying the above disadvantages (3) and (4), another evaporation source may be configured by covering the hot-cathode filament 7 and the end of the stick evaporation material 4 shown in FIG. 9 by another screening electrode.

However, the screening electrode is heated to a high temperature in a range of 600° to 800° C. by radiation heat from the evaporating end and the hot-cathode filament, and the gas discharge from the electrode is increased. Besides, radiation from the high-temperature screening electrode increases the temperature of the vacuum vessel wall, and the gas discharge is also increased.

(6) In any electron beam heating methods described above, a serious disadvantage over the above disadvantages (1) through (5) is that the electron beams ionize the atoms and molecules being evaporated to produce a large amount of ions. And, a portion of primary electrons from the filament does not serve for heating but is reflected and dissipated on the material surface to produce backscattered electrons which are added together with secondary electrons to the above ions. These ion and electron groups hit the film formed on the deposition substrate, greatly affecting on the structure and physical properties of the film.

(7) Besides, when the vacuum wall is hit by these backscattered electron groups, gas discharge from the wall is tremendous.

(8) In the method shown in FIG. 9, it is known to cover with the screening electrode to prevent the electrons from diffusing. In such a case, the screening electrode's electric potential may be determined to be an earth (zero) potential, namely at the same electric potential as the vacuum vessel, or an electric potential lower than the vacuum vessel. When it is a zero potential, positive ions produced by the electron bombardment hit the deposited film at the earth potential at a high speed, so that the film quality is enormously deteriorated. And, when the evaporation material is at the earth potential and the screening electrode and the filament are at the minus electric potential, not only the backscattered electrons but also the primary electrons from the filament hit the vacuum wall, and gas discharge from the wall is tremendous. A metallizing apparatus having the same electrode structure as the one shown in FIG. 9 was produced, and an electron current entering its vacuum wall was measured. It was found that backscattered electron groups corresponding to 20 to 30% of the primary electrons were entering the vacuum wall. At the time, it was also found that a degree of vacuum was degraded by two to three digits as compared with that before the electron bombardment and carbon monoxide gas which is most deleterious to the film formation was discharged in a large amount.

(9) An issue remained to be solved through the vacuum deposition technology in general for the resistance heating method in addition to the electron bombardment problem is that no appropriate method is available to directly measure a vapor pressure (molecular beam intensity) of evaporated atoms or molecules. The only one method now available measures the thickness of a film deposited to determine a film growth rate with an apparatus called a film pressure monitor which is provided in the neighborhood of the deposition substrate. This method cannot monitor accurately the molecular beam intensity in the neighborhood of the center of the molecular beams while depositing.

(10) Besides, in the case of the conventional device, radiation heat from the evaporation source is dissipated within the vacuum device to raise the temperature of the device. To prevent a degree of vacuum from being degraded by the gas discharge and the film formation from being affected adversely, the inner wall of the vacuum device is made to have a double structure, and a liquid nitrogen cooling shroud for circulating liquid nitrogen between the double layer of the inner wall is essential. Therefore, the device (particularly, MBE: molecular beam crystal growth device) becomes very expensive, its running cost is very high, and its operation is not easy. But, even if liquid nitrogen is used for cooling, a degree of vacuum retained while depositing was about $10^{-6}$ to $10^{-7}$ Pa.

(11) As to recent film forming technologies, attention is being given to a compound semiconductor film and an alloy magnetic film which occurs a chemical reaction and alloy on the deposition substrate by evaporating a plurality of different materials at the same time. But, the conventional methods shown in FIG. 7 to FIG. 9 need to dispose a plurality (the number of filaments) of evaporation sources within the same vacuum device, the device becomes large, and the disadvantages (1) to (10) described above are increased by the multiples of the number of devices used.

SUMMARY OF THE INVENTION

The invention has been completed in view of the above-described disadvantages of conventional technologies and aims to provide a vacuum evaporator which does not scatter electrons or ions and has a simple electrode structure, does not need water cooling or liquid nitrogen cooling, and has an evaporation source which does not scatter molecular beams from the deposition source or radiation heat to any parts other than a deposition substrate and can be produced inexpensively without degrading vacuum. Furthermore, it is aimed to provide a vacuum evaporator by which the molecular beam intensity while depositing can be monitored at the same time, and a plurality of materials are evaporated from a single evaporation source at the same time to easily form a compound semiconductor or an alloy film.

The invention described in claim 1 relates to a vacuum evaporator that a solid substance provided within a vacuum vessel is melted and evaporated or sublimed by electron impact heating to form atomic or molecular beams and to adhere onto a separately provided deposition substrate, characterized in that:

hot-cathode filaments are provided as an electron source around a tip of a rod evaporation material; a conductive cooling member of a good heat conductive metal which is partly contacted with the atmosphere is provided on the periphery of the rod evaporation material and the hot-cathode filaments in parallel to the rod evaporation material to decrease the dissipation of radiation heat produced from the hot-cathode filaments and the tip of the rod evaporation material into a vacuum vessel; and heat absorbed by the conductive cooling member is quickly conducted through the conductive cooling member and discharged to the atmosphere to prevent the temperature of an electron impact heating part from increasing and to prevent the increase of the gas discharge due to the heat dissipation from the electron impact heating part.

The invention described in claim 2 relates to a vacuum evaporator according to claim 1, wherein a screening electrode is provided between the electron impact heating part and the conductive cooling member to prevent the dissipation of electrons and ions generated from the evaporation tip of the rod evaporation material and the hot-cathode filaments.

The invention described in claim 3 relates to a vacuum evaporator according to claim 2, wherein the screening electrode is made to be an electrical potential lower than the hot-cathode filaments' potential, and an ion current flowing to the screening electrode is detected to monitor and detect evaporation intensities of evaporated atomic beams and molecular beams.

The invention described in claim 4 relates to a vacuum evaporator according to claim 2, wherein an atomic and molecular beam discharge port formed on the screening electrode has a meshed structure.

The invention described in claim 5 relates to a vacuum evaporator according to any one of claims 1 to 4, wherein the rod evaporation material is formed by bundling a plurality of different materials into one body.

In the above-configured vacuum evaporator, high-temperature radiation heat and conduction heat from the hot-cathode filament and the tip of the evaporation material do not enter an analyzer provided on the vacuum vessel wall or within the vacuum vessel but are quickly discharged outside through the conductive cooling member, and vacuum degradation due to the dissipation of various electrons and ions containing the backscattered electrons can be prevented, the deposited film can be prevented from being damaged, and water cooling or liquid nitrogen cooling is not required.

In addition, the intensity of the molecular beams at the time of depositing the evaporated atomic beams can be monitored, a plurality of different rod evaporation materials are integrally bundled to form the rod evaporation member, so that there is provided a vacuum evaporator having quartet effects which is a single evaporation device but can easily form a compound semiconductor or alloy on a deposition substrate.

Preferably, the screening electrode has a structure divided into two in the coaxial direction with the rod evaporation material, so that the ion current is monitored by the screening electrode having a meshed opening in the neighborhood of the tip of the rod evaporation material. The screening electrode is preferably configured to make degassing from the hot-cathode filament by electron impact. It is preferred to have a structure on the opposite side of the evaporation tip of the rod evaporation material so that the rod material which is consumed with evaporation can be fed.

DESCRIPTION OF THE PREFERRED EMBODIMENT

Figure 7:
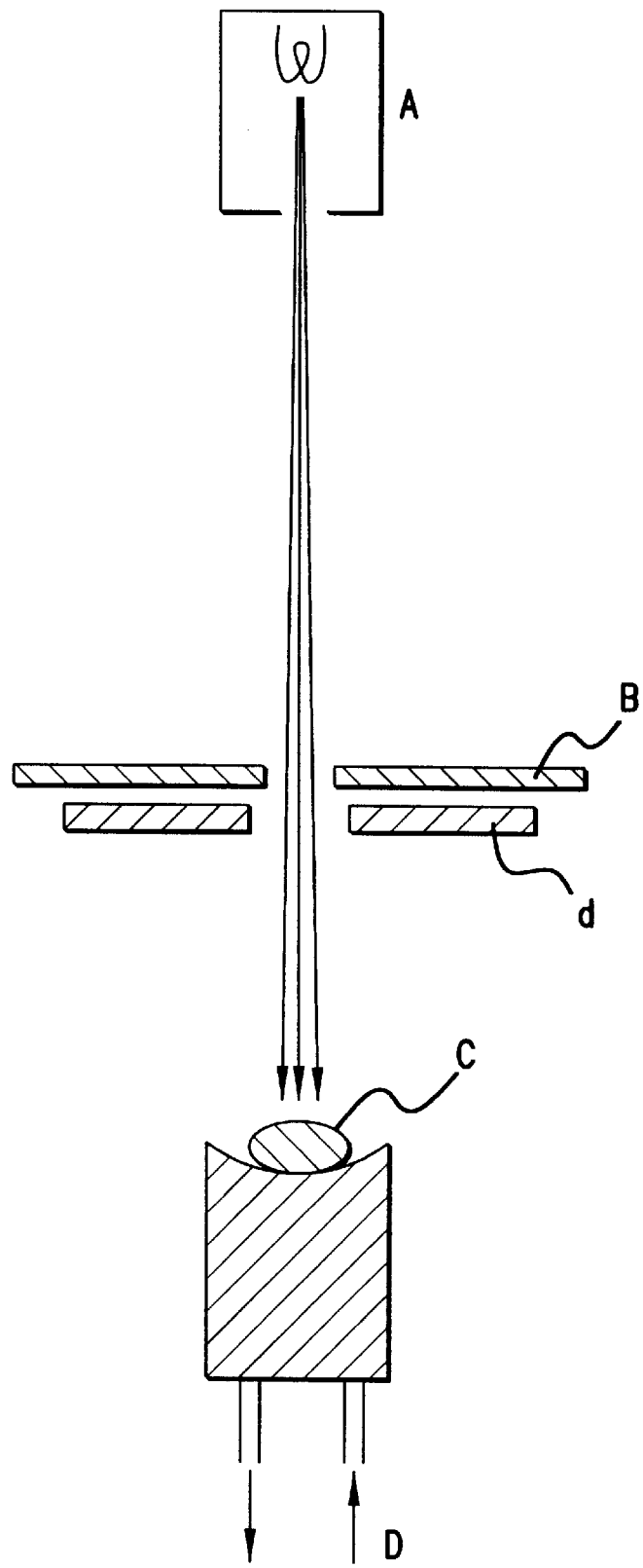
FIG. 7 is a conceptual diagram showing a conventional linear electron impact heating evaporation device.
Figure 8:
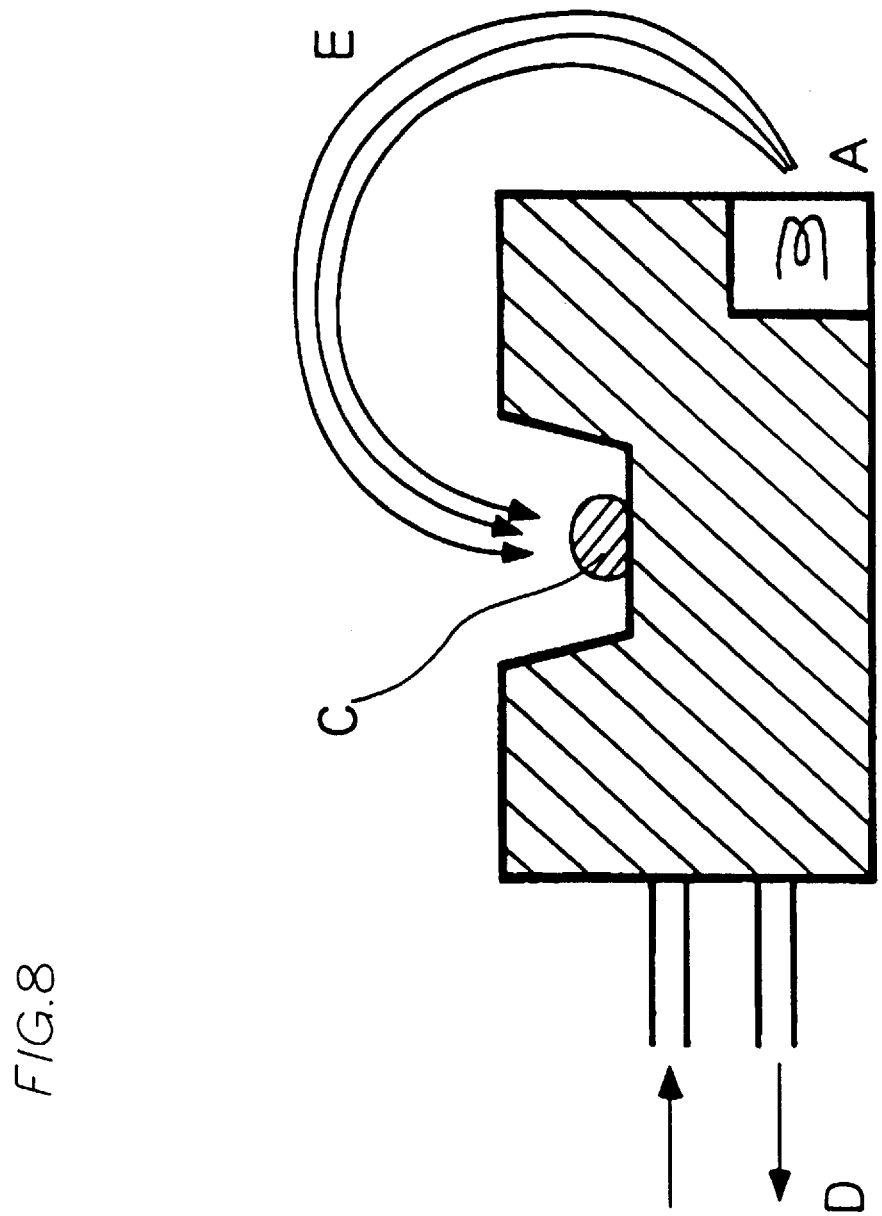
FIG. 8 is a conceptual diagram showing a conventional magnetic-deflection electron impact heating evaporation device.
Figure 9:
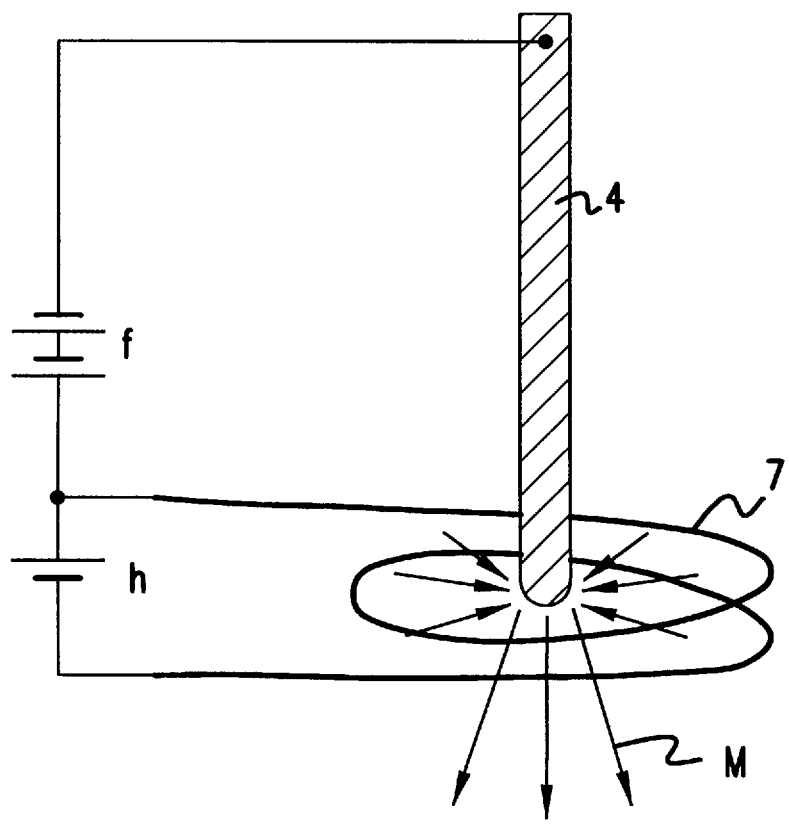
FIG. 9 is a conceptual diagram showing a conventional rod material electron impact heating evaporation device.

The invention will be described with reference to examples shown in the drawings. Components identical to those shown in FIG. 7 to FIG. 9 are given the same reference numerals.

Figure 1:
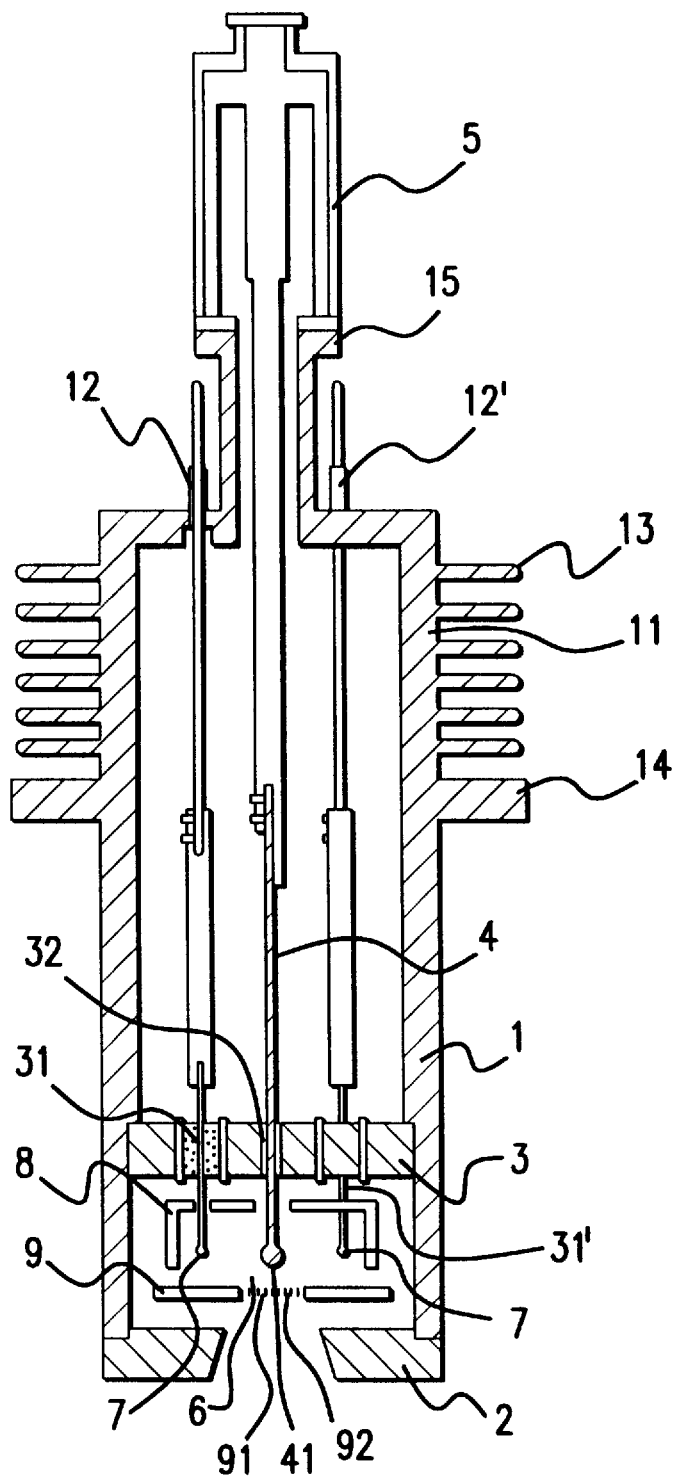
FIG. 1 is a sectional view showing a conductive cooling rod material electron impact heating evaporation device of the invention.

FIG. 1 shows a conduction cooling rod material electron impact heating evaporation device practicing the invention. In the drawing, 1 is a thick wall cylindrical conductive cooling member made of oxygen free copper, which is configured of a good heat conductor formed of copper or copper alloy or aluminum or aluminum alloy. A copper donut-like disk 2 which prevents ions produced by electron impact and radiation heat which does not serve for heating a material from being diffused to a vacuum vessel wall is fixed by bolts to one end of the conductive cooling member 1 which is disposed on the vacuum side. And, an electrode holder 3 made of oxygen free copper is fixed to the interior while retaining the above functions. Insulation terminal groups 31, 31' for fixing an electrode which configures an electron impact heating unit is fixed to the oxygen free copper electrode holder 3.

A portion 11 which is on the atmosphere side of the conductive cooling member 1 has a plurality of vacuum insulation terminals 12, 12' welded by electron beams, and also cooling fins 13 and a stainless steel vacuum flange 14 welded. And, a small stainless steel vacuum flange 15 is welded to the other end of the conductive cooling member 1, and a rod evaporation material 4 and an introduction member 5 for delivery are connected thereto.

At the center of the electrode holder 3, a hole 32 is formed to pass the rod evaporation material 4 therethrough, and the rod evaporation material 4 is slid through the hole 32 into an electron impact heating chamber 6. Within the electron impact heating chamber 6, a circular hot-cathode filament 7 made of a tungsten material is mounted on the two insulation terminals 31 in a substantially horizontal position with respect to a tip 41 of the rod evaporation material 4. And, the insulation terminals 31, 31' are electrically connected to the vacuum insulation terminals 12, 12'.

The filaments 7 and the tip 4 of the rod evaporation material 4 are surrounded by a tantalum metal cup-shaped screening electrode 8 which is mounted on another insulation terminal on the electrode holder 3 and two screening electrodes of a donut-shaped screening electrode 9. And, a hole 91 is formed at the center of the donut-shaped screening electrode 9 to inject evaporated molecular beams, and this hole has a fine screen 92 made of a very thin tungsten wire. The two screening electrodes 8, 9 are electrically independent each other and connected to the vacuum insulation terminal groups of the vacuum insulation terminal 12'.

The principle of operation of the invention will be described with reference to the above embodiment, and its effects will be described with reference to experiment data.

Figure 2:
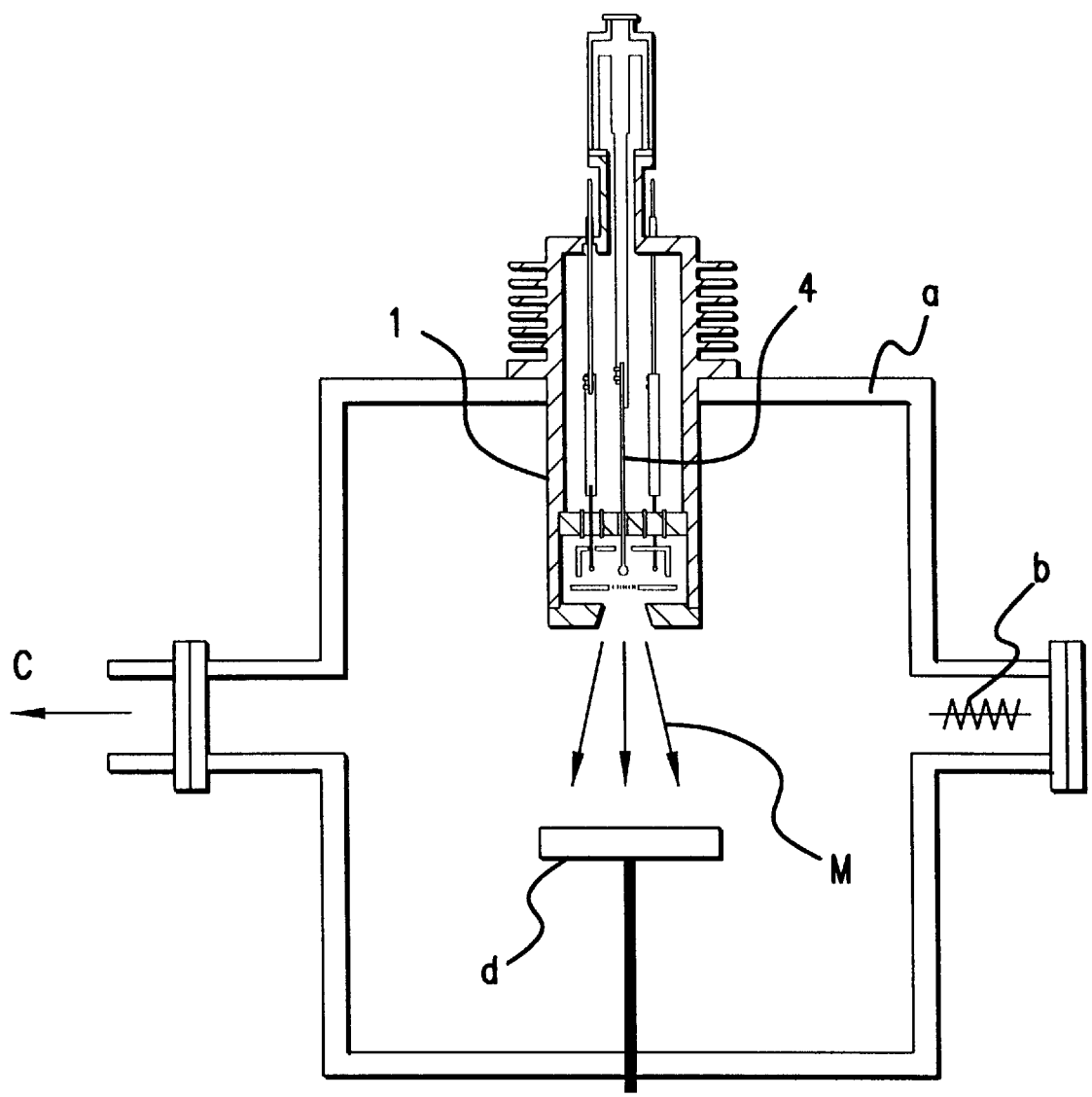
FIG. 2 is a sectional view showing a state of the evaporation device of the invention mounted on a vacuum vessel.

FIG. 2 shows a state that the evaporation device of the invention is mounted on a vacuum vessel. The conductive cooling member 1 is mounted on the upper part of a vacuum vessel a. The vacuum vessel a is made vacuous by a vacuum pump c (not shown). In the drawing, b is a vacuum gage, d is a substrate, and M is a molecular beam.

Figure 3:
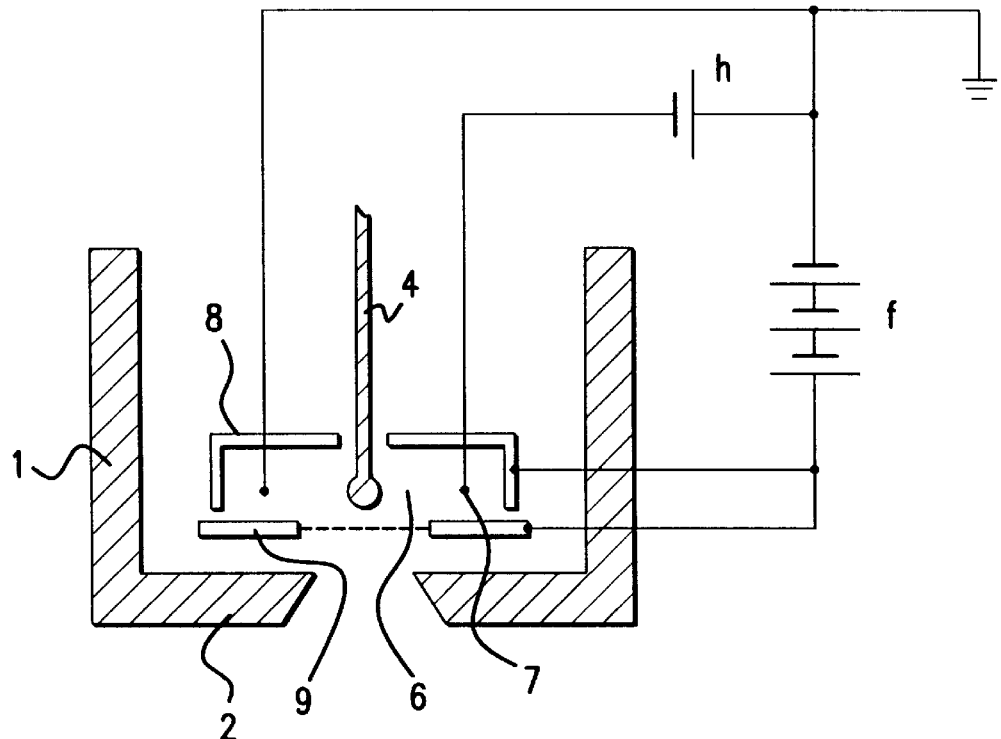
FIG. 3 is a degassing wiring diagram by an electron impact of a screening electrode of the invention.

The screening electrodes 8, 9 are wired through the vacuum terminals 12, 12' as shown in FIG. 3, and electron impact is performed to the two screening electrodes 8, 9 from the hot-cathode filaments 7 to make degassing.

When the electron impact of about 1 KV×60 mA is performed, the two screening electrodes 8, 9 have a temperature exceeding 1000° C. By this step, the gas discharge from the electrodes is lowered to a negligible level even when the temperatures of the screening electrodes 8, 9 are raised to 600° to 800° C. at the next electron impact heating deposition.

Figure 4:
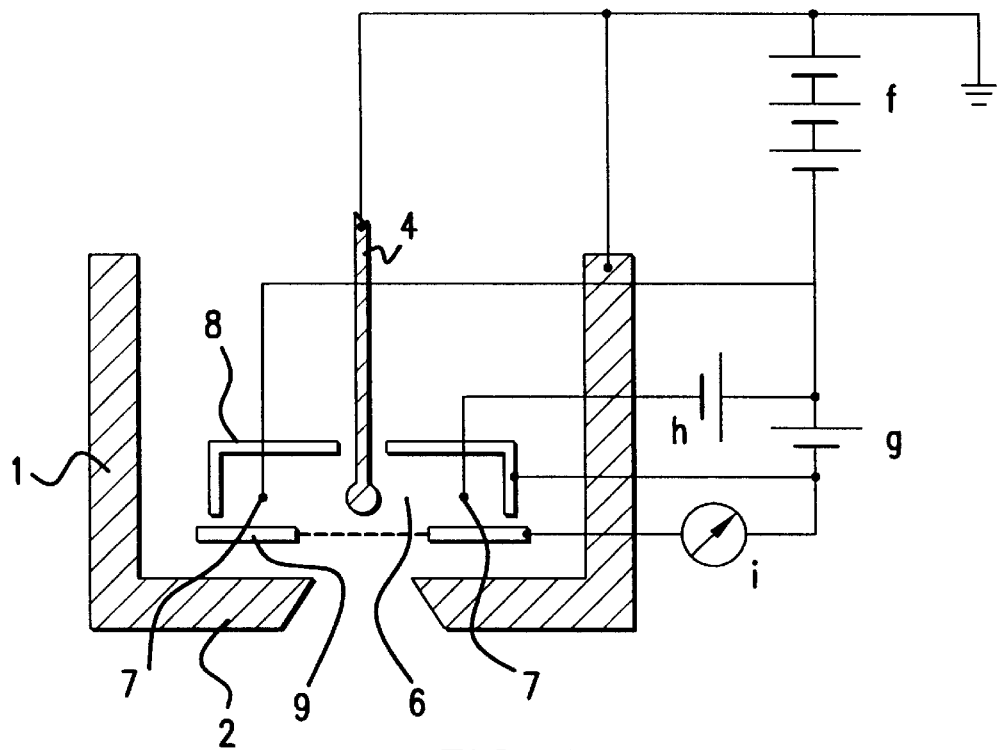
FIG. 4 is a wiring diagram at evaporating by the evaporation device of the invention.

The electrodes are wired with a positive electrode at an earth potential (the rod evaporation material 4) as shown in FIG. 4, a reverse bias voltage of −2 KV is applied to the hot-cathode filaments 7, and the screening electrodes 8, 9 are set to a level 20 to 30 V lower than the hot-cathode filaments' potential. In this state, the hot-cathode filaments 7 are turned on to hit the rod evaporation material 4 with electron impacts of 40 to 50 mA.

As a result, the tip 41 of the rod evaporation member 4 melts, and a liquid ball dangles from the tip of the solid rod material 4. For example, when silicon having a diameter of about 2 mm is used for the rod evaporation material 4, the liquid ball has a diameter of about 5 mm and a temperature exceeding 1700° C.

At the time, radiation heat from the hot-cathode filaments 7 and the tip 41 is shielded by the two screening electrodes 8, 9. Therefore, the two screening electrodes 8, 9 have a high temperature of 600° to 700° C., but since they are surrounded by the oxygen free copper conductive cooling member 1 having a very small emissivity (absorption rate of radiation heat) of 2%, 98% of heat is returned to the screening electrodes 8, 9, then to the filaments 7. Therefore, the heating electric power of the filaments 7 is lowered to ½ to ⅓ of prior art, and absorption of heat by the cooling member 1, the donut-shaped disk 2 and the electrode holder 3 is very small. In other words, there is provided an energy-saving electron impact heating structure.

Heat absorbed at a rate of 2% by the donut-shaped disk 2 and the electrode holder 3 is quickly discharged to the atmosphere through the oxygen free copper which has a very high heat conductivity, so that the temperature increase of the electron impact heating evaporation chamber 6 is suppressed to minimum. In the aforementioned example of the silicon material, the temperature at the head (the donut-shaped disk 2) of the conductive cooling member 1 was about 80° C.

Detrimental electron groups of backscattered electrons produced from the periphery of the electron impact heating evaporation source and secondary electrons are completely rebounded by the screening electrodes 8, 9, which are made negative with respect to the filament, to the rod material (positive electrode) to serve for heating. The screen 92 made of a very thin line formed on the hole 91 of the donut-shaped screening electrode 9 through which the evaporated molecules pass serves to completely prevent the backscattered electrons and secondary electrons from scattering toward the deposition substrate.

In the embodiment shown in FIG. 1, a disk electrode (not shown) was provided at the center hole of the donut-shaped cooling disk 2 with the screen 92 removed, and backscattered electrons and secondary electrons were measured. It was found that an electron current of 2 to 5 mA with an energy width of 0 to 300 eV came flying, and when a 30-mesh screen of a fine line having a permeability of 95% was used, an ammeter indicated zero. And, even when such screens were provided, it was found that a film formed on the deposition substrate and affected by the mesh of the screen was free from any spot, and a film with good quality could be formed. This effect results from the screen mesh which is smaller than the liquid ball at the tip of the evaporation material and disposed nearest to the evaporation source.

With the electrode structure described above, at the tip 41 of the rod evaporation material 4 where evaporation occurs by heating, evaporated electrons are partly ionized by the flying electrons to positive ions and flown to the screening electrodes 8, 9. At this time, the ion current flowing to the screening electrodes 8, 9 is an ion current of evaporated atoms generated by the electrons discharged from the hot-cathode filaments 7, and has the same function as a kind of hot-cathode ionization vacuum gage. In other words, when it is assumed that the steam pressure of evaporated atoms is P, the ion current is expressed as follow:

$$Ii=KPIe$$

where, Ii is an ion current, Ie is an electron current, K is a proportional constant related to an ionization probability of evaporated atoms and an electrode structure.

Therefore, the steam pressure of the evaporated atoms, namely an evaporated molecular beam intensity, can be seen by monitoring Ii. Especially, in the embodiment shown in FIG. 1, since the screening electrode is divided into two and the ion current on the evaporating side only can be monitored by the donut-shaped screening electrode 9, the intensity of molecular beams evaporating toward the substrate can be measured with high accuracy. In the examples shown in FIG. 1 and FIG. 2, by depositing on the substrate positioned about 100 mm away from the evaporation source, the results shown in Table 1 were obtained. And, vacuum during depositing could be retained at $10^{-6}$ to $10^{-7}$ without using liquid nitrogen.

TABLE 1

| Evaporation material (2-mm dia. rod) | Acceleration voltage E (KV) | Electron current Ie (mA) | Ion current Ii (μA) | Deposition rate Å/s |
|---|---|---|---|---|
| Silicon | 2 | 60 | 50 | to 1 |
| Iron | 1.5 | 30 | 80 | to 2 |

Description will be made of an ion impact problem that positive ions which are produced between the screen 92 of the screening electrode 9 and the tip 41 of the rod evaporation material 4 are partly accelerated by the screening electrode 9 to pass through the screen 82 toward the deposition substrate. This problem can also be solved by the present invention. Specifically, the positive ions moving through the screen 82 is accelerated from the electric potential intermediate between the screening electrode 9 and the tip 41 (an anode and an earth potential) of the rod deposition material 4, and many of the ions passed through the screen 92 are pushed back by the donut-shaped cooling disk 2 at an earth potential toward the screening electrode. Even the ions which have passed through a portion having a loose gradient of potential in the center hole of the donut-shaped cooling disk 2 cannot reach the deposition substrate located at the earth potential.

Description will be made of an embodiment of a rod evaporation member which is formed of a plurality of different materials bundled into one body.

Figure 5:
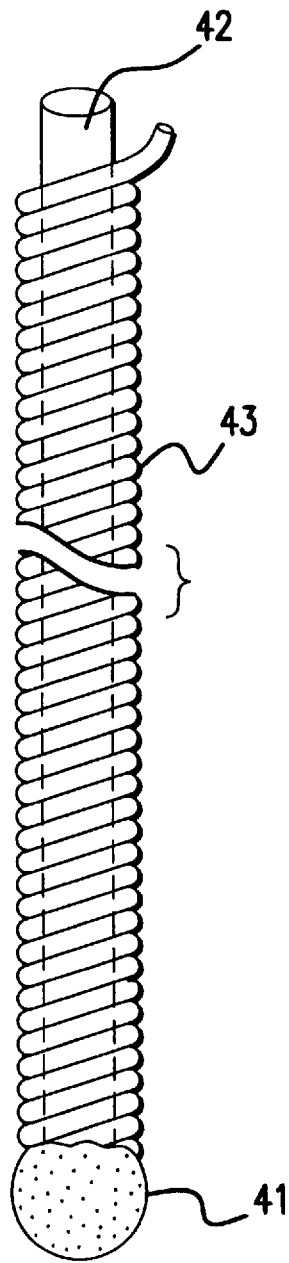
FIG. 5 is a diagram showing a composite rod evaporation member formed by winding around a rod material a different material in a spiral form.

FIG. 5 shows a composite rod evaporation member, which is the rod evaporation material 4 formed by winding a pure iron wire 43 having a diameter of 0.7 mm into a spiral form around a silicon core rod 42 having a diameter of 2 mm. When a tip of the evaporation material is heated by the electron impact, silicon and iron react to become ferrosilicon (FeSi2) and evaporate to form a compound semiconductor film on the substrate.

Figure 6:
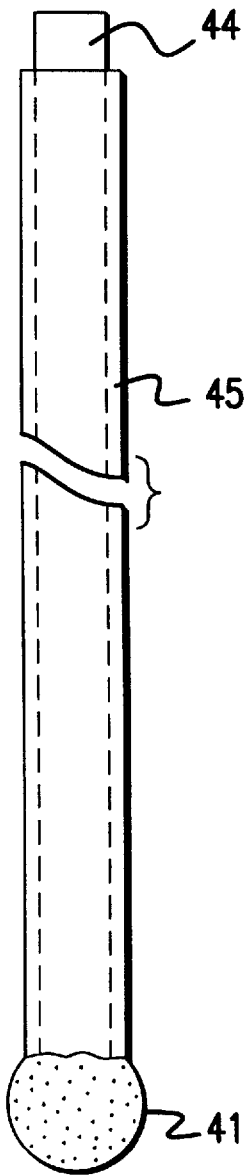
FIG. 6 is a diagram showing a composite rod evaporation member formed by covering a rod material with a different material which is formed into a pipe.

FIG. 6 shows an example of a composite rod evaporation member which is formed by covering a cobalt rod 44 as the core with an iron pipe 45. In this example, the two ferromagnetic metals are melted into a liquid ball 41 before evaporating to form a magnetic alloy film on the substrate. Cobalt and iron have different melting point and steam pressure, but a mixing ratio of the liquid ball can be adjusted by appropriately selecting the thickness of the core wire and external pipe, so that a film having the corresponding alloy ratio can be formed.

Besides, in this example, since the two ferromagnetic metals are melted into the liquid ball 41 before evaporating, it is preferable to provide a structure on the opposite side of the evaporation tip of the rod evaporation material so that the rod material which is consumed with evaporation can be fed.

In the above-described embodiment, the vacuum evaporation device that the hot-cathode filament is provided as the electron source around the tip of the rod evaporation material removes the excessive radiation heat, conductive heat, ions, scattered electrons and secondary electrons which are parts to form the evaporation section but detrimental to the deposition by forming into a structure the conductive cooling member of the good heat conductive metal of a continuous body of copper or copper alloy or aluminum or aluminum alloy which is partly contacted with the atmosphere, so that the screening electrode and its exterior are covered in parallel to the rod evaporation material. And, the ion current only is removed as a current through the screening electrode while removing, the evaporation rate is monitored, the liquid nitrogen cooling is not required, and the composite rod evaporation material is used as a single evaporation source, so that a compound semiconductor or alloy can be formed easily on a substrate. Thus, a simple and inexpensive high-performance electron impact heating evaporation model is provided to solve the described disadvantages.

The invention is not limited to the rod evaporation material, but a plurality of rod evaporation materials may be arranged side to side or may be formed into a plate to provide the evaporation source. And, the evaporation source is not limited to be disposed vertically in the vacuum device, but may be arranged to evaporate horizontally or vertically. In summary, in a vacuum evaporator that a solid substance provided within a vacuum vessel is melted and evaporated or sublimed by electron impact heating to form atomic or molecular beams and to adhere onto a separately provided deposition substrate, a conductive cooling member of a good heat conductive metal such as a continuous body of copper or copper alloy or aluminum or aluminum alloy which is partly in contact with the atmosphere is provided on the periphery of the rod evaporation material and hot-cathode filaments in parallel to the rod evaporation material inclusively to decrease the dissipation of radiation heat into a vacuum vessel; and heat absorbed from the hot-cathode filaments and a tip of the rod evaporation material by the conductive cooling member is quickly conducted through the conductive cooling member and discharged to the atmosphere to prevent the temperature of an electron impact heating part from increasing and to prevent the increase of the gas discharge due to the heat dissipation from the electron impact heating part. And, the screening electrode is provided around the electron impact heating part to prevent the dissipation of the electrons and ions produced from the evaporation tip of the rod evaporation material and the hot-cathode filament. This screening electrode is made to an electrical potential lower than the hot-cathode filament's potential, and an ion current flowing to this electrode is detected so that the atomic beams and the evaporation rate of the evaporated atomic beams can be monitored. Besides, for the rod evaporation material, by bundling a plurality of different materials or by integrally overlaying a plurality of rod pipes into a rod shape to form a composite rod evaporation member, a single evaporation device may have a different structure as far as it can form a compound semiconductor or alloy on the melting evaporation source or the deposition substrate.

The invention described in claim 1 relates to a vacuum evaporator that a solid substance provided within a vacuum vessel is melted and evaporated or sublimed by electron impact heating to form atomic or molecular beams and to adhere onto a separately provided deposition substrate, characterized in that:

hot-cathode filaments are provided as an electron source around a tip of a rod evaporation material; a conductive cooling member of a good heat conductive metal which is partly in contact with the atmosphere is provided on the periphery of the rod evaporation material and the hot-cathode filaments in parallel to the rod evaporation material to decrease the dissipation of radiation heat produced from the hot-cathode filaments and a tip of the rod evaporation material into a vacuum vessel; and heat absorbed by the conductive cooling member is quickly conducted through the conductive cooling member and discharged to the atmosphere to prevent the temperature of an electron impact heating part from increasing and to prevent the increase of the gas discharge due to the heat dissipation from the electron impact heating part.

The invention described in claim 2 relates to a vacuum evaporator according to claim 1, wherein a screening electrode is provided between the electron impact heating part and the conductive cooling member to prevent the dissipation of electrons and ions generated from the evaporation tip of the rod evaporation material and the hot-cathode filaments.

The invention described in claim 3 relates to a vacuum evaporator according to claim 2, wherein the screening electrode is made to be an electrical potential lower than the hot-cathode filaments' potential, and an ion current flowing to the screening electrode is detected to monitor and detect evaporation intensities of evaporated atomic beams and molecular beams.

The invention described in claim 4 relates to a vacuum evaporator according to claim 2, wherein an atomic and molecular beam discharge port formed on the screening electrode has a meshed structure.

The invention described in claim 5 relates to a vacuum evaporator according to any one of claims 1 to 4, wherein the rod evaporation material is formed by bundling a plurality of different materials into one body.

Therefore, the high-temperature radiation heat and the conductive heat from the hot-cathode filament and the tip of the evaporation material do not enter an analyzer provided on the vacuum vessel wall or within the vacuum vessel but are quickly discharged outside through the conductive cooling member, and vacuum degradation due to the dissipation of various electrons and ions containing the backscattered electrons can be prevented, the deposited film can be prevented from being damaged, and water cooling or liquid nitrogen cooling is not required.

In addition, the intensity of the molecular beams at the time of depositing the evaporated atomic beams can be monitored, and a plurality of different rod evaporation materials are integrally bundled to form the rod evaporation member, so that there is provided a vacuum evaporator having quartet effects, which is a single evaporation device but can easily form a compound semiconductor or alloy on a deposition substrate.

What is claimed is:

1. A vacuum evaporator wherein a solid substance provided within a vacuum vessel is melted and evaporated or sublimed by electron impact heating to form atomic or molecular beams for adhering onto a separately provided deposition substrate, characterized in that:

hot-cathode filaments are provided as an electron source around a tip of a rod evaporation material; a conductive cooling member of a good heat conductive metal which is partly contacted with the atmosphere is provided on the periphery of the rod evaporation material and the hot-cathode filaments in parallel to the rod evaporation material to decrease the dissipation of radiation heat produced from the hot-cathode filaments and the tip of the rod evaporation material into a vacuum vessel; and heat absorbed by the conductive cooling member is quickly conducted through the conductive cooling member and discharged to the atmosphere to prevent the temperature of an electron impact heating part from increasing and to prevent the increase of the gas discharge due to the heat dissipation from the electron impact heating part.

2. A vacuum evaporator according to claim 1, wherein a screening electrode is provided between the electron impact heating part and the conductive cooling member to prevent the dissipation of electrons and ions generated from the evaporation tip of the rod evaporation material and the hot-cathode filaments.

3. A vacuum evaporator according to claim 2, wherein the screening electrode is made to be an electrical potential lower than the hot-cathode filaments' potential, and an ion current flowing to the screening electrode is detected to monitor and detect evaporation intensities of evaporated atomic beams and molecular beams.

4. A vacuum evaporator according to claim 2, wherein an atomic and molecular beam discharge port formed on the screening electrode has a mesh structure.

5. A vacuum evaporator according to any one of claims 1 to 4, wherein the rod evaporation material is formed by bundling a plurality of different materials into one body.

* * * * *